(12) United States Patent
Han et al.

(10) Patent No.: US 11,863,126 B2
(45) Date of Patent: Jan. 2, 2024

(54) PHASE SHIFTER WITH FUNCTION OF CONTROLLING BEAM SIDE LOBE

(71) Applicant: ELECTRONICS AND TELECOMMUNICATIONS RESEARCH INSTITUTE, Daejeon (KR)

(72) Inventors: Seon-Ho Han, Daejeon (KR); Bon Tae Koo, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 421 days.

(21) Appl. No.: 17/327,401

(22) Filed: May 21, 2021

(65) Prior Publication Data
US 2021/0367337 A1 Nov. 25, 2021

(30) Foreign Application Priority Data
May 22, 2020 (KR) .......................... 10-2020-0061309

(51) Int. Cl.
*H03D 7/14* (2006.01)
*H03D 7/16* (2006.01)

(52) U.S. Cl.
CPC ......... *H03D 7/1483* (2013.01); *H03D 7/1441* (2013.01); *H03D 7/1458* (2013.01); *H03D 7/165* (2013.01)

(58) Field of Classification Search
CPC ..... H03D 7/1483; H03D 7/1441; H03D 7/165
See application file for complete search history.

(56) References Cited

U.S. PATENT DOCUMENTS 5,625,318 A * 4/1997 Sevenhans ............. H03H 11/22
330/252
8,653,893 B2 2/2014 Tsuchi
(Continued)

FOREIGN PATENT DOCUMENTS

KR 10-1832491 B1 2/2018
KR 10-1939859 B1 1/2019
(Continued)

OTHER PUBLICATIONS

Kwang-Jin Koh and Gabriel M. Rebeiz, "0.13-um CMOS Phase Shifters for X-, Ku, and K-Band Phased Arrays", IEEE, 2007.
(Continued)

*Primary Examiner* — Patricia T Nguyen (57) ABSTRACT

Disclosed is a phase shifter, which includes a signal generator that generates a first signal and a second signal having a phase orthogonal to a phase of the first signal, and outputs the first signal and the second signal, an operator that generates a first current and a second current, and amplifies the first current and the second current, and a signal converter converting a first digital signal and a second digital signal. The operator includes an input circuit converting the first signal and the second signal, a path selection circuit determining paths of the generated first current and the generated second current, and a cascode circuit buffering the first current and the second current. The operator sums the first current and the second current, controls a vector of the first current and a vector of the second current, and generates a voltage signal through an output load.

20 Claims, 8 Drawing Sheets

(56) References Cited

U.S. PATENT DOCUMENTS

| | | | |
|---|---|---|---|
| 8,693,970 B2* | 4/2014 | Corman | H04B 7/10 |
| | | | 343/756 |
| 8,699,626 B2* | 4/2014 | Saunders | H04L 27/362 |
| | | | 375/316 |
| 8,817,672 B2* | 8/2014 | Corman | H04B 1/44 |
| | | | 370/278 |
| 9,231,559 B1 | 1/2016 | Davis | |
| 9,564,805 B2 | 2/2017 | Sano et al. | |
| 9,866,341 B2 | 1/2018 | Kim et al. | |
| 10,659,021 B2 | 5/2020 | Yeo | |
| 2011/0142113 A1* | 6/2011 | Hokazono | H04L 27/362 |
| | | | 375/298 |
| 2011/0150495 A1 | 6/2011 | Nosaka et al. | |
| 2013/0102266 A1* | 4/2013 | Kitsunezuka | H04B 1/10 |
| | | | 455/263 |
| 2014/0355655 A1* | 12/2014 | Chakraborty | H04B 1/40 |
| | | | 375/219 |
| 2019/0222205 A1* | 7/2019 | Yeo | H03H 11/32 |
| 2020/0021024 A1 | 1/2020 | Park | |
| 2020/0067516 A1 | 2/2020 | Oh et al. | |

FOREIGN PATENT DOCUMENTS

| | | |
|---|---|---|
| KR | 10-2019-0028915 A | 3/2019 |
| KR | 10-2019-0086897 A | 7/2019 |

OTHER PUBLICATIONS

Kwang-Jin Koh, et al. "An X- and Ku-Band 8-Element Phased-Array Receiver in 0.18-um SiGe BiCMOS Technology", IEEE JSSC, vol. 43, No. 6, Jun. 2008.

* cited by examiner

PHASE SHIFTER WITH FUNCTION OF CONTROLLING BEAM SIDE LOBE

CROSS-REFERENCE TO RELATED APPLICATIONS

This application claims priority under 35 U.S.C. § 119 to Korean Patent Application No. 10-2020-0061309, filed on May 22, 2020 in the Korean Intellectual Property Office, the disclosures of which are incorporated by reference herein in their entireties.

BACKGROUND

Embodiments of the present disclosure described herein relate to a phase shifter, and more particularly, relate to a phase shifter with a function of controlling a beam side lobe.

A conventional phase shifter using a vector sum has four stages of transistors from a ground voltage to a power supply voltage, so it is difficult to drive at a low voltage.

In addition, the conventional phase shifter does not have a function of providing an antenna weight factor to a phase array antenna.

SUMMARY

Embodiments of the present disclosure provide a phase shifter that controls a current by using a digital signal and controls a phase of an output signal through an amplification circuit including a current path selection circuit.

In addition, embodiments of the present disclosure provide a phase shifter capable of amplifying a current even when a low voltage is applied through provided two-stage transistors therein.

According to an embodiment of the present disclosure, a phase shifter includes a signal generator that generates a first signal and a second signal having a phase orthogonal to a phase of the first signal, and outputs the generated first signal and the generated second signal, an operator that generates a first current based on the first signal, generates a second current based on the second signal, and amplifies the first current and the second current, and a signal converter that converts a first digital signal determining a magnitude of the first current into a first analog signal, and converts a second digital signal determining a magnitude of the second current into a second analog signal. The operator includes an input circuit that converts the first signal into the first current, based on the first analog signal, and converts the second signal into the second current, based on the second analog signal, a path selection circuit that determines paths of the generated first current and the generated second current, and a cascode circuit that buffers the first current and the second current of which the paths are determined. The operator sums the first current and the second current, controls a vector of the first current and a vector of the second current, and generates a voltage signal through an output load.

According to an embodiment of the present disclosure, the cascode circuit and the input circuit are connected in series with each other, and the cascode circuit receives the first current and the second current, and the output load sums the vector of the first current and the vector of the second current in a reference voltage range to generate the voltage signal.

According to an embodiment of the present disclosure, the output load further includes a signal controller configured to control an input and output gain of the summed voltage signal, based on a weight factor.

According to an embodiment of the present disclosure, the operator has an RLC output load including a capacitor, an inductor, and an equivalent resistor, which has a resonant frequency equal to a frequency of an input signal of the phase shifter.

According to an embodiment of the present disclosure, the RLC output load and a signal controller are placed in a load of the operator or a load of an independent amplifier.

According to an embodiment of the present disclosure, the signal controller includes a plurality of transistors, and is configured to control the input and output gain of the summed voltage signal by controlling a turn on resistance, based on a switching operation of the plurality of transistors.

According to an embodiment of the present disclosure, the signal controller includes a plurality of transistor switches and a plurality of resistors, and is configured to control the input and output gain of the summed voltage signal, based on an equivalent magnitude of the plurality of resistors.

According to an embodiment of the present disclosure, the signal converter increases a magnitude value of the first current, based on the first digital signal and the second digital signal, decreases a magnitude value of the second current, and generates an output phase value based on the magnitude values of the first current and the second current.

According to an embodiment of the present disclosure, the signal converter decreases a magnitude value of the first current, based on the first digital signal and the second digital signal, increases a magnitude value of the second current, and generates an output phase value, based on the magnitude values of the first current and the second current.

According to an embodiment of the present disclosure, the signal converter provides a plurality of pairs of two transistors connected in series, and receives a digital signal having a preset number of bits, and mirrors the first current and the second current by using the plurality of pairs of the two transistors, based on the input digital signal.

According to an embodiment of the present disclosure, an operating method of a phase shifter comprises generating a first signal and a second signal, the second signal is having a phase orthogonal to the first signal, outputting the first signal and the second signal, converting a first digital signal determining a magnitude of a first current into a first analog signal and a second digital signal determining a magnitude of a second current into a second analog signal, generating the first current based on the first analog signal and the second current based on the second analog signal and performing an operation for the first current based on the first signal the second current based on the second signal. The performing an operation for the first current and the second current includes determining paths of the first current and the second current, buffering the first current and the second current for which the paths are determined, summing the first current and the second current, adjusting the sum of the first current and the second current and generating a voltage signal based on a result of the adjustment.

According to an embodiment of the present disclosure, the sum of the first current and the second current is adjusted in a reference voltage range.

According to an embodiment of the present disclosure, the operation method of the phase shifter further comprises controlling a magnitude and a weight factor of the sum of the first current and the second current. The performing an operation for the first current and the second current includes determining the weight factor of the sum of the first current and the second current based on the paths of the first current and the second current.

According to an embodiment of the present disclosure, the magnitude and the weight factor of the sum of the first current and the second current is controlled based on switching operating of a plurality of transistors.

According to an embodiment of the present disclosure, the controlling a magnitude and a weight factor of the sum of the first current and the second current comprises adjusting a magnitude of a variable resistor and controlling the magnitude of the sum of the first current and the second current based on the magnitude of the variable resistor.

According to an embodiment of the present disclosure, the performing an operation for the first current and the second current comprises calculating a resonance frequency of capacitor or inductor in output load and matching a frequency of the sum of the first current and the second current with the calculated resonance frequency.

According to an embodiment of the present disclosure, the phase shifter increases the magnitude of the first current, based on the first digital signal and the second digital signal, decreases the magnitude of the second current, and generates an output phase value based on the magnitude of the sum of the first current and the second current.

According to an embodiment of the present disclosure, the phase shifter decreases the magnitude of the first current, based on the first digital signal and the second digital signal, increases the magnitude of the second current, and generates an output phase value based on the magnitude of the sum of the first current and the second current.

According to an embodiment of the present disclosure, the converting a first digital signal determining a magnitude of a first current into a first analog signal and a second digital signal determining a magnitude of a second current into a second analog signal comprises receiving the first digital signal and the second digital signal having a preset number of bits and mirroring the first current and the second current based on the first digital signal and the second digital signal.

According to an embodiment of the present disclosure, an operating method of a phase shifter further comprises controlling the magnitudes of the first signal and the second signal, respectively and converting phases of the first signal and the second signal, respectively, based on the first current and the second current for which the paths are determined.

BRIEF DESCRIPTION OF THE FIGURES

The above and other objects and features of the present disclosure will become apparent by describing in detail embodiments thereof with reference to the accompanying drawings.

FIG. 4 is a diagram illustrating a configuration of a signal controller of

FIG. 3.

DETAILED DESCRIPTION

Throughout the specification, the same reference numerals refer to the same components. This specification does not describe all elements of the embodiments, and overlaps between general contents or embodiments in the technical field to which the present disclosure pertains are omitted. The term "unit, module, member, or block" used in the specification may be implemented by software or hardware, and according to embodiments, it is also possible that a plurality of "unit, module, member, or block" may be implemented as one component, or that one "part, module, member, or block" includes a plurality of components.

Throughout the specification, when a part is "connected" to another part, this includes a case of being directly connected as well as being connected indirectly, and indirect connection includes connecting through a wireless communication network.

Also, when a part is said to "comprise" a certain component, this means that other components may be further included instead of excluding other components unless specifically stated otherwise. Terms such as first and second are used to distinguish one component from other components, and the component is not limited by the above-described terms. In each of steps, an identification code is used for convenience of description, and the identification code does not describe the order of each of the steps, and each of the steps may be performed differently from the specified order, unless a specific order is explicitly stated in the context.

Hereinafter, the principle and embodiments of the present disclosure will be described with reference to accompanying drawings.

Figure 1:
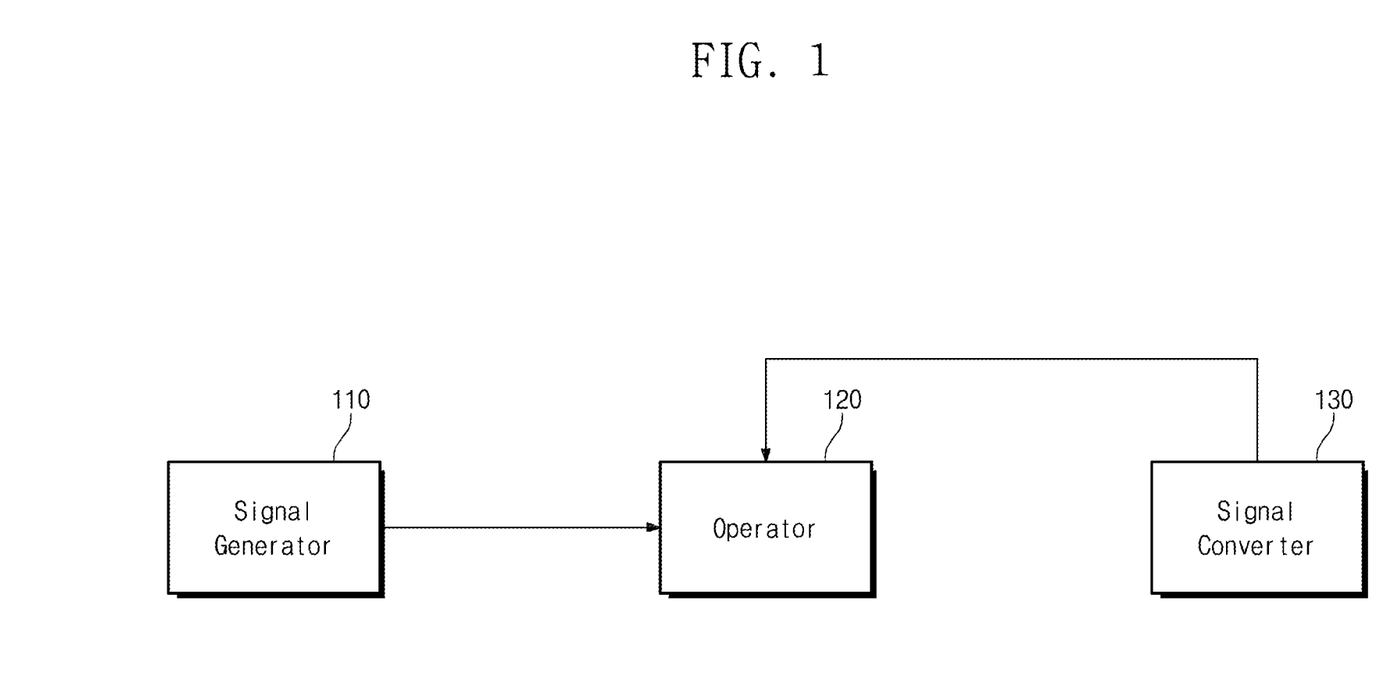
FIG. 1 is a block diagram of a phase shifter according to an embodiment of the present disclosure.
Figure 2:
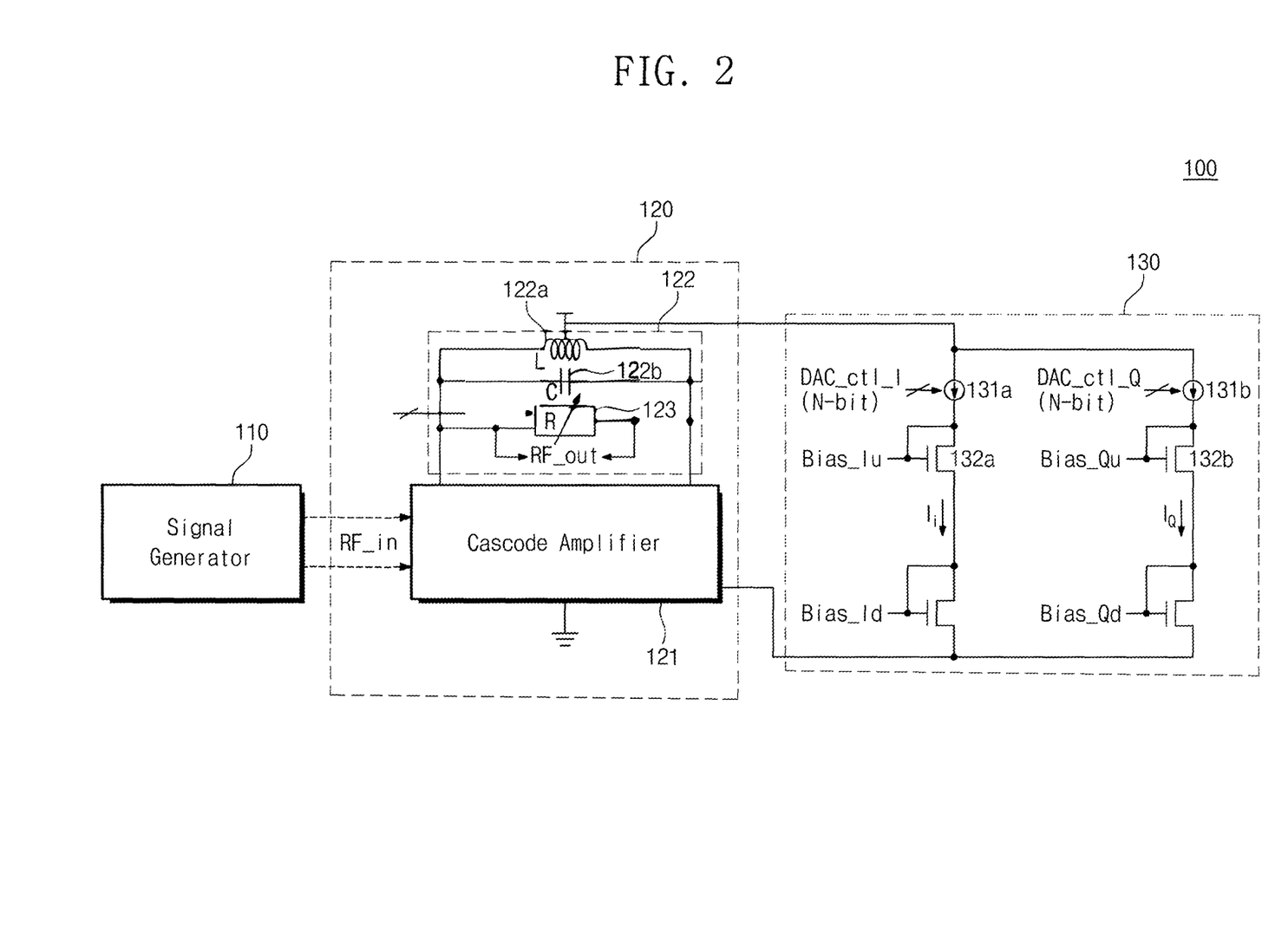
FIG. 2 is a circuit diagram illustrating a phase shifter of FIG. 1.

FIG. 1 is a block diagram of a phase shifter 100 according to an embodiment of the present disclosure. FIG. 2 illustrates a circuit diagram of the phase shifter 100 of FIG. 1.

Referring to FIG. 1, the phase shifter 100 may include a signal generator 110, an operator 120, and a signal converter 130. The signal generator 110 may generate a first signal RF_I and a second signal RF_Q having a phase orthogonal to a phase of the first signal RF_I. In FIG. 2, the first signal RF_I and the second signal RF_Q are denoted by RF_in as an example. For example, the signal generator 110 may include a resistor (not illustrated), an inductor (not illustrated), or a capacitor (not illustrated). The signal generator 110 may generate the first signal RF_I and the second signal RF_Q that have a phase orthogonal to each other by using the resistor (not illustrated), the inductor (not illustrated), or the capacitor (not illustrated).

The operator 120 includes a cascode amplifier 121 and an output load 122.

The operator 120 receives the first signal RF_I and the second signal RF_Q from the signal generator 110, and generates a first current corresponding to the first signal RF_I and a second current corresponding to the second signal RF_Q. The operator 120 may determine a path of the first current and a path of the second current, and may control phases of the first current and the second current. The operator 120 sums the first current and the second current and generates a summed first current and a summed second current. The operator 120 may generate a voltage signal based on the generated summed first and second currents. For example, the operator 120 may determine a phase of a sum of the first signal and the second signal by a vector sum method. The detailed configuration and operation of the operator 120 will be described in detail with reference to FIG. 3.

The signal converter 130 may convert a digital signal having information associated with the first current and the second current into an analog signal. The signal converter 130 mirrors the current to the operator 120, based on the converted analog signal. The signal converter 130 receives the digital signal having a preset number of bits (N-bit), and mirrors the current to the operator 120, based on the input digital signal. For example, the signal converter 130 may include two pairs of transistors connected in series, and may mirror the current to the operator 120 by using the two pairs of transistors.

Figure 3:
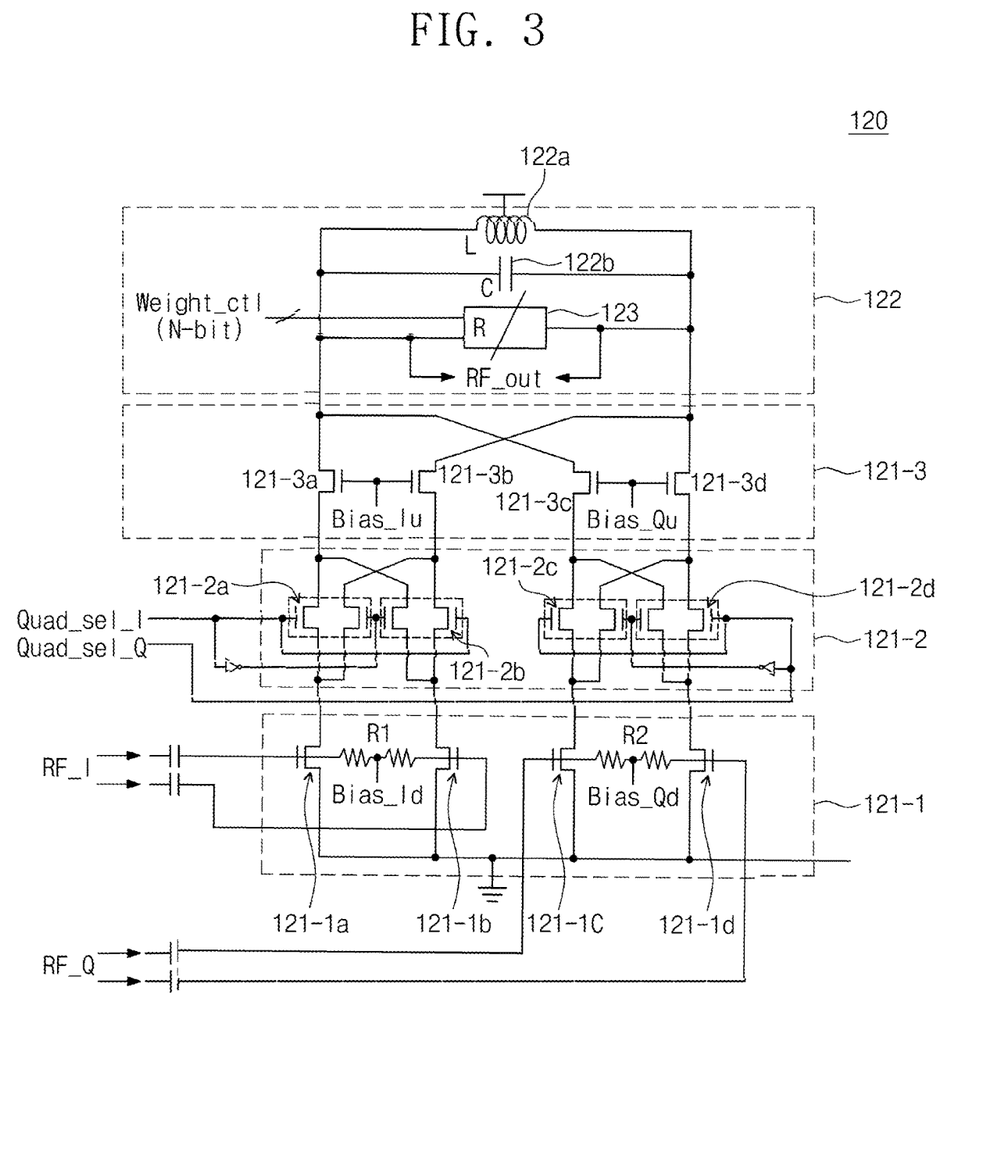
FIG. 3 is a circuit diagram illustrating an operator illustrated in FIG. 2.

FIG. 3 illustrates a circuit diagram of the operator 120 illustrated in FIG. 2.

Referring to FIG. 3, the operator 120 may include the cascode amplifier 121 and the output load 122. The cascode amplifier 121 may include an input circuit 121-1, a path selection circuit 121-2, and a cascode amplification circuit 121-3.

The input circuit 121-1 generates the first current corresponding to the first signal RF_I and the second current corresponding to the second signal RF_Q, based on a current mirroring result of the signal converter 130. For example, the input circuit 121-1 may include four transistors 121-a, 121-b, 121-c, and 121-d, and may include two resistors R1 and R2. The transistors 121-a and 121-b may generate the first current in response to the first signal RF_I input to their gate electrodes. In addition, the transistors 121-c and 121-d may generate the second current in response to the second signal RF_Q input to their gate electrodes.

The path selection circuit 121-2 may determine paths of the generated first and second currents. In this case, the determined paths of the first and second currents become a basis for phase control of the first and second currents. The path selection circuit 121-2 may include a transistor pair 121-2a and a transistor pair 121-2b that are controlled by a first selection signal Quad_sel_I and an inverted first selection signal. In addition, the path selection circuit 121-2 may include a transistor pair 121-2c and a transistor pair 121-2d that are controlled by a second selection signal Quad_sel_Q and an inverted second selection signal.

For example, each of the four transistor pairs 121-2a, 121-2b, 121-2c, and 121-2d of the path selection circuit 121-2 may operate as a switch. As the transistors constituting the four transistor pairs 121-2a, 121-2b, 121-2c, and 121-2d are controlled by the first selection signal Quad_sel_I and the inverted first selection signal, and the second selection signal Quad_sel_Q and the inverted second selection signal, the operator 120 may control the paths of the first current and the second current.

The cascode amplification circuit 121-3 buffers the first current and the second current of which the paths are determined, and transfers the buffered first current and the second current to the output load 122. For example, the cascode amplification circuit 121-3 may include a pair of transistors 121-3a and 121-3b of which gate electrodes are connected to each other and which receive the first current of which the paths are determined through their source electrodes. In addition, the cascode amplification circuit 121-3 may include a pair of transistors 121-3c and 121-3d of which gate electrodes are connected to each other and which receive the second current of which the paths are determined through their source electrodes. As a result of the buffering, the vector sum of the first current and the second current may be facilitated.

In other words, except for the transistors constituting the path selection circuit 121-2, the transistors 121-1a, 121-1b, 121-1c, and 121-1d of the input circuit 121-1 are connected to the transistors 121-3a, 121-3b, 121-3c, and 121-3d of the cascode amplification circuit 121-3 in two stages. As a result, since only two stages of transistors are stacked, the operator 120 may operate even at a low voltage, and the isolation characteristics of the input terminal and the output terminal may be improved.

The output load 122 may receive and add the first current and the second current, and may generate the summed first and second currents. As a result of the sum of the first current and the second current, the sum of a vector of the first current and a vector of the second current may be adjusted. In this case, the sum of the vectors outputs a corresponding intermediate phase vector value by summing the magnitudes of the first and second currents having an orthogonal relationship to each other, and the magnitude of the summed signal is uniform. The summed first current and second current flow through the output load to generate an output voltage signal. The output load 122 includes an inductor 122a, a capacitor 122b, and a signal controller 123. For example, the output load 122 may match a resonant frequency of the inductor 122a or the capacitor 122b with a frequency of the summed first and second currents.

Figure 4:
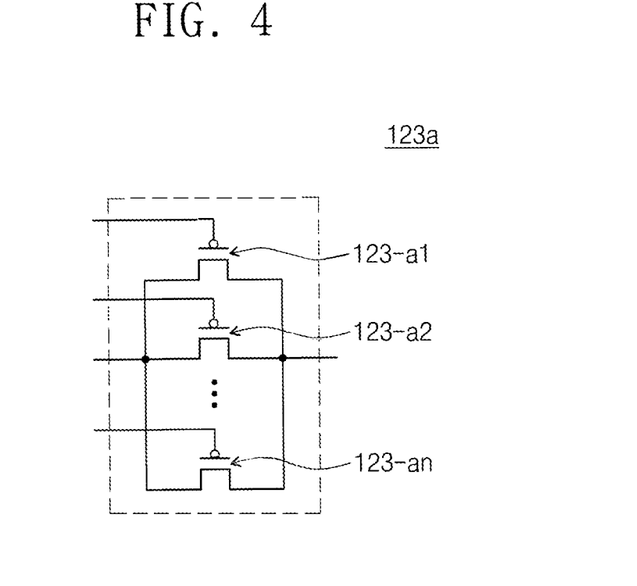

FIG. 4 illustrates a configuration of the signal controller 123 of FIG. 3. The signal controller 123a may include the plurality of transistors 123-a1 to 123-an, each of which is controlled by a control signal and connected in parallel to one another. Since each of the transistors 123-a1 to 123-an has an ON-resistance component when each of the transistors is turned on, the transistors 123-a1 to 123-an are separately controlled, thereby adjusting the equivalent resistance of an entire RLC resonance circuit. As a result, the summed first current and second current flows to the load, such that a magnitude of the output voltage signal may be controlled. That is, a final input and output signal gain is controlled.

Figure 5:
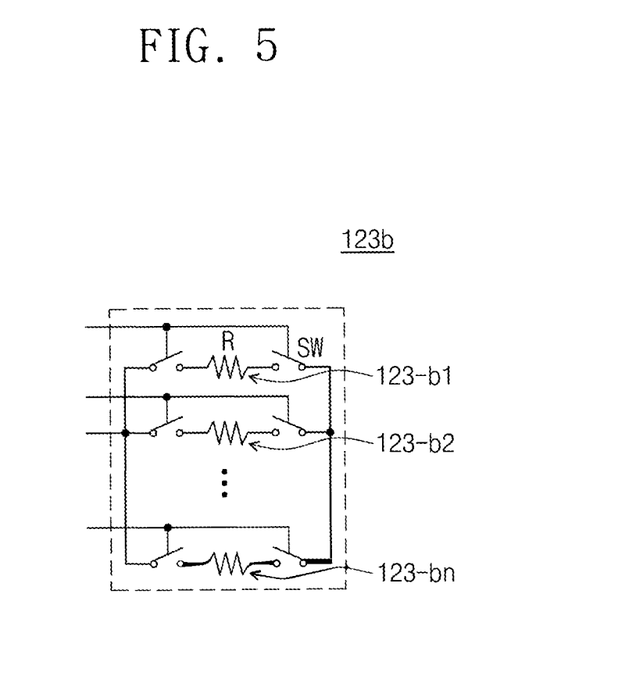
FIG. 5 is a diagram illustrating another configuration of a signal controller of FIG. 3.

FIG. 5 illustrates another configuration of the signal controller 123 of FIG. 3. The signal controller 123b may include a plurality of resistors R, and switches SW that are controlled by a control signal may be connected to both ends of each resistor. As the switches SW are turned on or off by the control signal, and then some or all of the resistors R are connected in parallel, a total resistance value may be adjusted. As a result, the magnitude of the summed first and second currents may be controlled.

Figure 6:
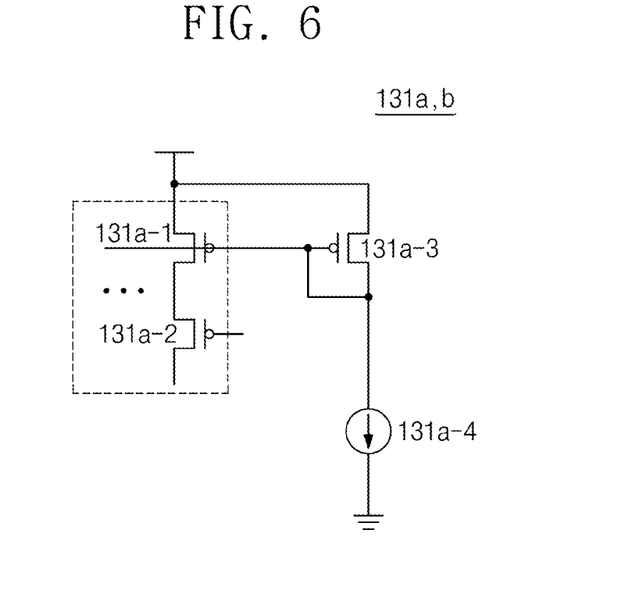
FIG. 6 is a diagram illustrating a digital-to-analog converter according to an embodiment of the present disclosure.

FIG. 6 illustrates a digital-to-analog converter 131a and 131b according to an embodiment of the present disclosure.

The digital-to-analog converter may include bias circuits 131a-3 and 131a-4, and a plurality of transistors 131a-1 to 131a-2 that receive a plurality of digital input signals to generate corresponding currents. That is, like the transistors 131a-1 and 131a-2, there are as many connected transistors as the number of digital input signals. In this case, as the plurality of transistors 131a-2 are turned on/off by the digital input signals, the bias current of the plurality of transistors 131a-1 corresponds to a current magnitude according to the digital input signals, which flows to a current mirror circuit below. The transistor 131a-1 and the transistor 131a-2 may be connected in series to each other. The source electrode of the transistor 131a-1 and the source electrode of the transistor 131a-3 may be connected to each other, and the gate electrode of the transistor 131a-1, and the drain electrode and the gate electrode of the transistor 131a-3 may be connected to one another. For example, the digital-to-analog converter 131a may receive the digital signal having the preset number of bits through the gate electrode of the transistor 131a-2. In response to the digital signal having the preset number of bits, the digital-to-analog converter 131a converts a first digital signal into a first analog signal, and converts a second digital signal into a second analog signal. In addition, the signal converter 130 performs a current mirroring to the operator 120, based on the first analog signal and the second analog signal. As a result of performing the current mirroring, the input circuit 121-1 may generate the first current and the second current.

Figure 7:
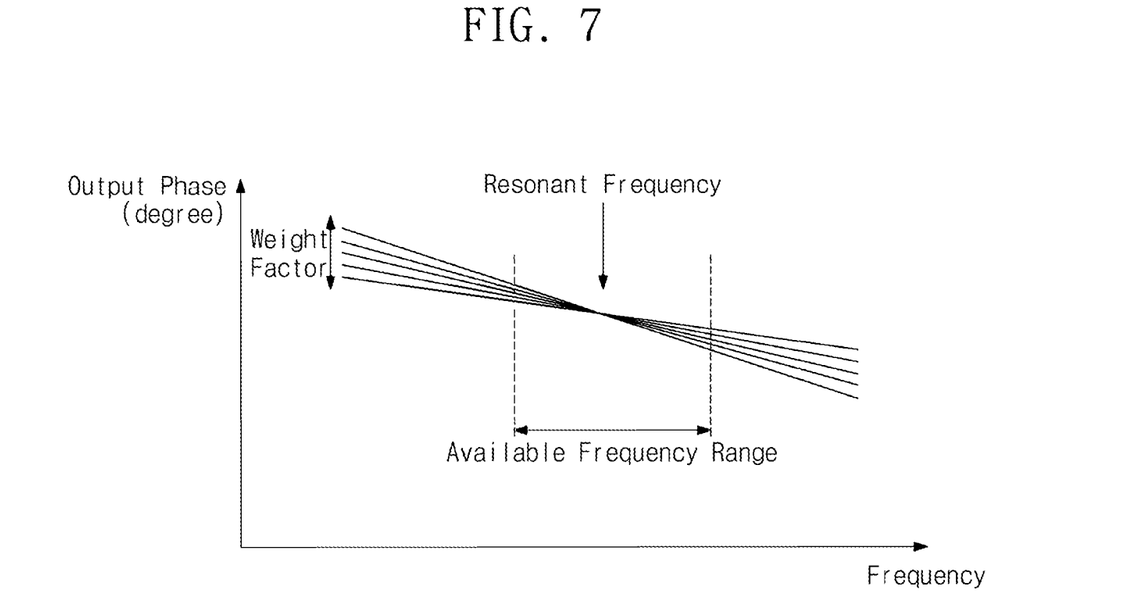
FIG. 7 is a graph illustrating a result of a phase control during a magnitude control for an antenna weight factor according to an embodiment of the present disclosure.

FIG. 7 is a graph illustrating a result of a phase control during a magnitude control for an antenna weight factor according to an embodiment of the present disclosure.

In the graph, an x-axis represents a frequency band, and a y-axis represents the output magnitude. Referring to FIG. 3 together, the cascode amplifier 121 of the operator 120 buffers the first current and the second current. In addition, the signal controller 123 of the operator 120 controls the input and output gain by controlling the equivalent resistance value of the RLC load, and controls the antenna weight factor. The principle is that when the resonant frequency of the RLC load is the same as a center frequency of the transferred signal, the L and C disappear equivalently due to the resonance, and only the resistance value remains. Since only the resistance value changes equivalently, only the gain of the signal changes and the phase of the signal does not change. In this gain control method, the RLC load may be used for the output load of the phase shifter or may be used for the output load of an amplifier designed independently. This is necessary because when the output phase value of the phase shifter is set to a specific value and the gain of each cell in the phase array needs to be adjusted for the purpose of removing the side lobe of the beam, etc., a main beam may be continuously radiated in a desired direction only when the phase value of each cell that has already been set does not change.

Figure 8:
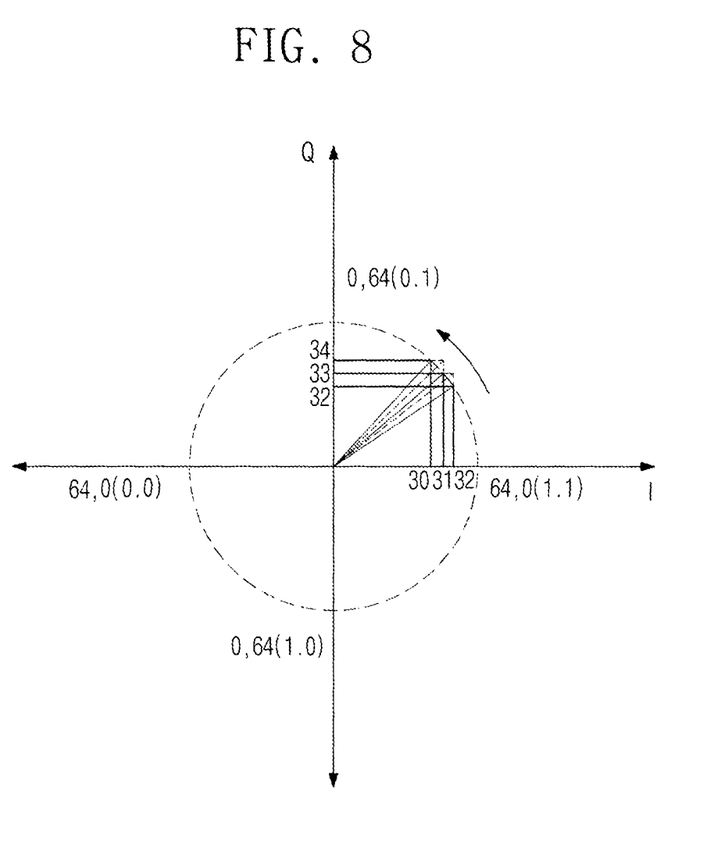
FIG. 8 is a diagram describing how a phase shifter according to an embodiment of the present disclosure controls a phase of an output signal.

FIG. 8 illustrates how the phase shifter 100 according to an embodiment of the present disclosure controls a phase of an output signal.

Referring to FIG. 8, an x-axis of the graph represents a magnitude I of a final signal due to the first current, and a y-axis represents a magnitude Q of a final signal due to the second current. By summing the magnitude I and the magnitude Q of the two final signals, the final signal has an arbitrary phase value.

In detail, as the operator 120 sums the magnitude I and the magnitude Q of the two final signals in the process of controlling the magnitudes of the first current and the second current, the final signal has an arbitrary phase value, and to further increase a phase resolution even with the input of the same N-bit digital-analog converter, the following method may be used. For example, in a signal in which the sum of the first current signal and the second current signal is 64, to increase the resolution, the operator 120 may allow the magnitude values 32 and 32 of the first current and the second current to be changed to the final magnitude values 31 and 33 through the intermediate values 32 and 33. That is, the phase shifter 100 of the present disclosure may generate the intermediate values in the process of adjusting the vector sum. With a code sweep control described above, the operator 120 may generate an intermediate phase value, and may increase the resolution without increasing the number of bits of a phase control code value of the digital-analog converter.

Figure 9:
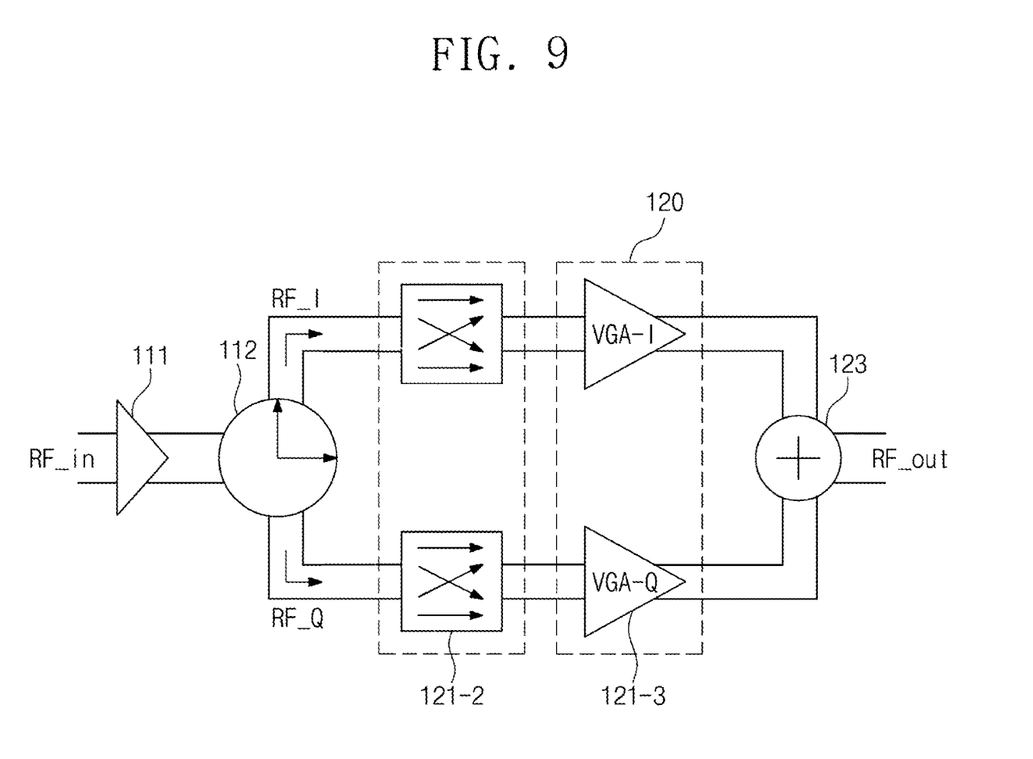
FIG. 9 is a flowchart illustrating how a phase shifter according to an embodiment of the present disclosure synthesizes a phase of an output signal.

FIG. 9 illustrates how the phase shifter 100 according to an embodiment of the present disclosure synthesizes a phase of an output signal. Although a method of synthesizing the phase of the output signal by the phase shifter 100 in FIG. 9 is illustrated in steps, this is for ease of description. That is, it should be understood that the phase shifter 100 of the present disclosure operates organically to generate the output signal corresponding to a set value in response to the input signal under a predetermined setting. Hereinafter, reference will be made to FIG. 3 together to aid in understanding the description.

The signal generator 110 generates the first signal and the second signal (S1001). In this case, the first signal and the second signal are signals having a phase orthogonal to each other. Also, the first signal and the second signal may be radio frequency (RF) voltage signals, but are not limited thereto. Further, the first signal includes first current information, and the second signal includes second current information.

When the first signal and the second signal are generated, the signal converter 130 converts the input digital signal into the analog signal, based on a preset number of bits "N-bit" (S1002). For example, the signal converter 130 converts the first digital signal into the first analog signal and converts the second digital signal into the second analog signal.

When the input digital signal is converted into the analog signal, the signal converter 130 generates the first current and the second current by performing the current mirroring to the operator 120, based on the first and second current signals (S1003). The current mirroring may be performed by the plurality of transistors 132a, 132b, 132c, and 132d of the signal converter 130. In detail, the plurality of transistors 132a, 132b, 132c, and 132d are connected in the cascode structure, and the signal converter 130 may perform the current mirroring depending on a symmetry of the circuit. As described above, the first current is generated based on the first signal RF_I, and the second current is generated based on the second signal RF_Q. Specifically, the first signal RF_I and the second signal RF_Q may be converted into the current signal by the input circuit 121-1.

When the first current and the second current are generated, the path selection circuit 121-2 selects a path of the first current and a path of the second current (S1004). For example, the path selection circuit 121-2 may select the paths of the first current and the second current, based on the switching operations of the transistors, and as a result of the path selections, the operator 120 may determine the phases of the first and second currents. Also, the transistors provided in the path selection circuit 121-2 are controlled by the digital signals, and are provided such that a phase range of the final output signal of the operator 120 is selected to be one of the quadrants of 360 degrees. In this case, the digital signal may be the first selection signal Quad_sel_I for determining the path of the first current and the second selection signal Quad_sel_Q for determining the path of the second current.

When the paths of the first and second currents are determined, the cascode amplification circuit 121-3 buffers the first and second currents (S1005). When the first and second currents are buffered, the magnitudes of the currents of I and Q mirrored under the control of the signal converter 130 are changed, and the phase of the final summed signal changes based on the relative magnitudes of the currents of I and Q.

The signal controller 123 includes a plurality of transistors or a plurality of resistors, and controls an equivalent resistance value of the RLC load. The principle is that when the equivalent resistance value of the RLC load is controlled and the resonant frequency of the RLC load is the same as the center frequency of the transferred signal, the L and C disappear equivalently due to the resonance, and only the resistance value remains. As only the resistance value changes equivalently, only the gain of the signal changes and the phase of the signal does not change. In this gain control method, the RLC load may be used for the output load of the phase shifter or may be used for the output load of an amplifier designed independently.

The output load 122 sums the first current and the second current, and generates the final signal having the final phase value, by changing the signal to a voltage (S1006). In this case, the final signal refers to a signal having the intermediate phase vector depending on the relative magnitudes of the first current and the second current.

Figure 10:
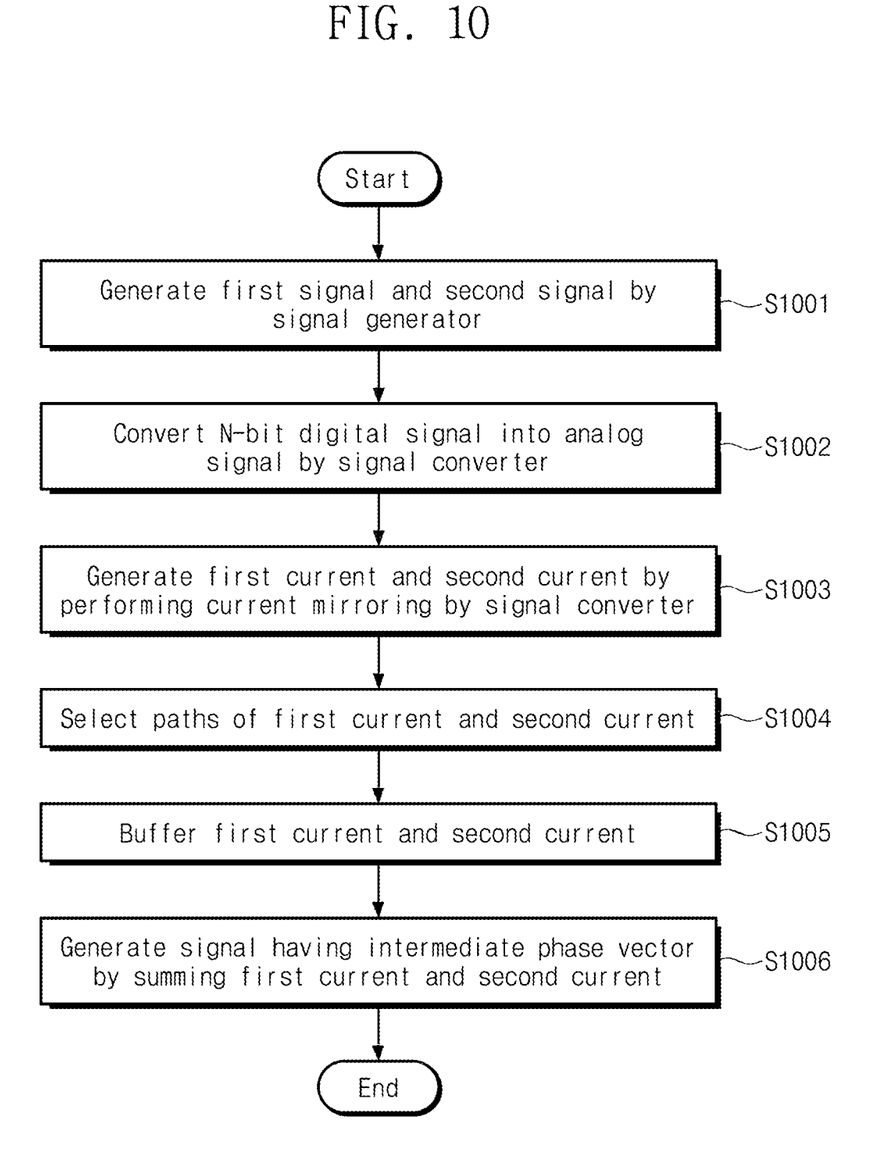
FIG. 10 is a diagram describing a phase array transceiver including a phase shifter described in FIGS. 1 to 9.

FIG. 10 illustrates a phase array transceiver including the phase shifter 100 described in FIGS. 1 to 9. A phase array transceiver 200 includes an antenna array 210 including two-dimensionally arranged antennas. The phase array transceiver 200 forms the beam based on energy radiated from each of the antennas. The phase array transceiver 200 may transmit or receive a wireless RF signal so as to overlap the formed beam. For example, the phase array transceiver 200 may be a radar apparatus.

The beam formed by the phase array transceiver 200 may include one main lobe ML and side lobes SL1 to SL4. The main lobe ML may be defined as a lobe in a direction in which the most energy is radiated in a beam formed by the phase array transceiver 200. The side lobes SL1 to SL4 may be defined as lobes in a direction in which energy is radiated in the direction other than the main lobe ML. The side lobes SL1 to SL4 are formed based on less energy than the main lobe ML. The phase array transceiver 200 controls energy radiated from the antenna array 210 to form the main lobe ML in a reception direction of the RF signal. However, in the process of generating the main lobe ML by radiating energy through a plurality of antennas, the plurality of side lobes SL1 to SL4 may be generated in a direction other than the direction in which the main lobe ML is formed.

The phase array transceiver 200 may control a size and a phase of signals for the plurality of antennas to form a beam for transmitting and receiving the RF signal. The phase array transceiver 200 may control each of the antennas to adjust the direction and the magnitude of the beam. The phase array transceiver 200 allows energy provided to the plurality of side lobes SL1 to SL4 to be minimize by using the phase shifter 100 described in FIGS. 1 to 9. To this end, phase shifters corresponding to each of the antennas may be included in the phase array transceiver 200.

For example, when a specific antenna has the greatest influence on the formation of the first side lobe SL1, the phase shifter 100 corresponding to the specific antenna may control the magnitude of the beam to be low. As described above, in the phase shifter 100, under the control of the signal converter 130, the cascode amplifier 121 may buffer and transfer the current to the output load 122, and the output load 122 may minimize a phase change according to the magnitude control. That is, since the phase array transceiver 200 according to an embodiment of the present disclosure controls a size of the phase shifter 100 corresponding to each of the antennas and suppresses the phase change according to the size control, the transmission and reception of RF signals by the side lobes SL1 to SL4 may be minimized.

According to an embodiment of the present disclosure, a phase shifter may operate at a relatively low voltage, based on a vector sum circuit method using active elements.

In addition, according to an embodiment of the present disclosure, the phase shifter may obtain a high phase resolution.

In addition, according to an embodiment of the present disclosure, the phase shifter may minimize a phase change value according to gain control for array antenna weight control by controlling the equivalent resistance of the RLC output load, based on the output gain control by the output load control.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A phase shifter comprising:
   a signal generator configured to generate a first signal and a second signal having a phase orthogonal to a phase of the first signal, and to output the generated first signal and the generated second signal;
   an operator configured to generate a first current based on the first signal, to generate a second current based on the second signal, and to amplify the first current and the second current; and
   a signal converter configured to convert a first digital signal determining a magnitude of the first current into a first analog signal, and to convert a second digital signal determining a magnitude of the second current into a second analog signal,
   wherein the operator includes:
   an input circuit configured to convert the first signal into the first current, based on the first analog signal, and to convert the second signal into the second current, based on the second analog signal;
   a path selection circuit configured to determine paths of the generated first current and the generated second current; and
   a cascode circuit configured to buffer the first current and the second current of which the paths are determined, and
   wherein the operator sums the first current and the second current, controls a vector of the first current and a vector of the second current, and generates a voltage signal through an output load.

2. The phase shifter of claim 1, wherein the cascode circuit and the input circuit are connected in series with each other, and the cascode circuit receives the first current and the second current, and
   wherein the output load sums the vector of the first current and the vector of the second current in a reference voltage range to generate the voltage signal.

3. The phase shifter of claim 2, wherein the output load further includes a signal controller configured to control an input and output gain of the summed voltage signal, based on a weight factor.

4. The phase shifter of claim 1, wherein the operator has an RLC output load including a capacitor, an inductor, and an equivalent resistor, which has a resonant frequency equal to a frequency of an input signal of the phase shifter.

5. The phase shifter of claim 4, wherein the RLC output load and a signal controller are placed in a load of the operator or a load of an independent amplifier.

6. The phase shifter of claim 3, wherein the signal controller includes a plurality of transistors, and is configured to control the input and output gain of the summed voltage signal by controlling a turn on resistance, based on a switching operation of the plurality of transistors.

7. The phase shifter of claim 3, wherein the signal controller includes a plurality of transistor switches and a plurality of resistors, and is configured to control the input and output gain of the summed voltage signal, based on an equivalent magnitude of the plurality of resistors.

8. The phase shifter of claim 1, wherein the signal converter increases a magnitude value of the first current, based on the first digital signal and the second digital signal, decreases a magnitude value of the second current, and generates an output phase value based on the magnitude values of the first current and the second current.

9. The phase shifter of claim 1, wherein the signal converter decreases a magnitude value of the first current, based on the first digital signal and the second digital signal, increases a magnitude value of the second current, and generates an output phase value, based on the magnitude values of the first current and the second current.

10. The phase shifter of claim 1, wherein the signal converter provides a plurality of pairs of two transistors connected in series, and receives a digital signal having a preset number of bits, and mirrors the first current and the second current by using the plurality of pairs of the two transistors, based on the input digital signal.

11. An operating method of a phase shifter comprising:
generating a first signal and a second signal, the second signal is having a phase orthogonal to the first signal;
outputting the first signal and the second signal;
converting a first digital signal determining a magnitude of a first current into a first analog signal and a second digital signal determining a magnitude of a second current into a second analog signal;
generating the first current based on the first analog signal and the second current based on the second analog signal; and
performing an operation for the first current based on the first signal the second current based on the second signal,
wherein the performing an operation for the first current and the second current includes:
determining paths of the first current and the second current;
buffering the first current and the second current for which the paths are determined;
summing the first current and the second current;
adjusting the sum of the first current and the second current; and
generating a voltage signal based on a result of the adjustment.

12. The operation method of the phase shifter of claim 11, the sum of the first current and the second current is adjusted in a reference voltage range.

13. The operation method of the phase shifter of claim 12, further comprising controlling a magnitude and a weight factor of the sum of the first current and the second current,
wherein the performing an operation for the first current and the second current includes determining the weight factor of the sum of the first current and the second current based on the paths of the first current and the second current.

14. The operation method of the phase shifter of claim 13, the magnitude and the weight factor of the sum of the first current and the second current is controlled based on switching operating of a plurality of transistors.

15. The operation method of the phase shifter of claim 13, wherein the controlling a magnitude and a weight factor of the sum of the first current and the second current comprising:
adjusting a magnitude of a variable resistor; and
controlling the magnitude of the sum of the first current and the second current based on the magnitude of the variable resistor.

16. The operation method of the phase shifter of claim 11, wherein the performing an operation for the first current and the second current comprising:
calculating a resonance frequency of capacitor or inductor in output load; and
matching a frequency of the sum of the first current and the second current with the calculated resonance frequency.

17. The operation method of the phase shifter of claim 11, the phase shifter increases the magnitude of the first current, based on the first digital signal and the second digital signal, decreases the magnitude of the second current, and generates an output phase value based on the magnitude of the sum of the first current and the second current.

18. The operation method of the phase shifter of claim 11, the phase shifter decreases the magnitude of the first current, based on the first digital signal and the second digital signal, increases the magnitude of the second current, and generates an output phase value based on the magnitude of the sum of the first current and the second current.

19. The operation method of the phase shifter of claim 11, wherein the converting a first digital signal determining a magnitude of a first current into a first analog signal and a second digital signal determining a magnitude of a second current into a second analog signal comprising:
receiving the first digital signal and the second digital signal having a preset number of bits; and
mirroring the first current and the second current based on the first digital signal and the second digital signal.

20. The operation method of the phase shifter of claim 11, further comprising:
controlling the magnitudes of the first signal and the second signal, respectively; and
converting phases of the first signal and the second signal, respectively, based on the first current and the second current for which the paths are determined.

* * * * *